United States Patent [19]

Müller et al.

[11] Patent Number: 4,723,116
[45] Date of Patent: Feb. 2, 1988

[54] ELECTROMAGNET SYSTEM FOR NUCLEAR SPIN TOMOGRAPHY

[75] Inventors: Wolfgang Müller, Karlsruhe; Günther R. Laukien, Rheinstetten, both of Fed. Rep. of Germany

[73] Assignee: Bruker Analytische Messtechnik GmbH, Fed. Rep. of Germany

[21] Appl. No.: 48,419

[22] Filed: May 11, 1987

[30] Foreign Application Priority Data

May 13, 1986 [DE] Fed. Rep. of Germany ....... 3616078

[51] Int. Cl.[4] .............................................. H01F 7/00
[52] U.S. Cl. .................................... 335/296; 324/320; 335/299
[58] Field of Search ............... 335/296, 297, 299, 301; 324/318, 319, 320, 321

[56] References Cited

U.S. PATENT DOCUMENTS

| | | | |
|---|---|---|---|
| 3,513,422 | 5/1970 | Watson et al. | 335/296 |
| 3,622,869 | 11/1971 | Golay | 324/0.5 R |
| 4,318,043 | 2/1980 | Crooks et al. | 324/309 |
| 4,656,449 | 4/1987 | Mallard et al. | 335/299 |
| 4,658,229 | 4/1987 | Chen et al. | 335/299 |
| 4,672,346 | 6/1987 | Miyamoto et al. | 335/296 |

FOREIGN PATENT DOCUMENTS

| | | | |
|---|---|---|---|
| 1292885 | 6/1956 | Fed. Rep. of Germany | 324/318 |
| 3418812 | 5/1984 | Fed. Rep. of Germany | 324/318 |

OTHER PUBLICATIONS

Review of Scientific Instruments, vol. 52, (12), Dec. 1981, pp. 1910–1912 (article by David H. West: "Computer-Assisted Magnet Shimming").

Primary Examiner—George Harris
Attorney, Agent, or Firm—Kokjer, Kircher, Bradley, Wharton, Bowman & Johnson

[57] ABSTRACT

An electromagnet system for nuclear spin tomography comprises a ferromagnetic yoke (41), two pole pieces (42, 43) arranged on the said yoke (41) with their pole faces (51, 52) facing each other, and at least one excitation coil (47, 48). The pole pieces (42, 43) delimit an air gap (44) having a diameter-to-width ratio of less than 2.5. There is arranged in the area of each of the pole faces (51, 52) formed by the pole pieces (42, 43) at least one substantially two-dimensional supplementary coil (55, 56, 57, 58) whose number of ampere turns is between 0.1% and 10% of the number of ampere turns of the excitation coil (47, 48). The excitation and supplementary coils generate together in the air gap (44) a magnetic field (B) which exhibits a homogeneity better than $10^{-4}$ in a spherical volume having a diameter equal to half the value of the width (H) of the air gap.

10 Claims, 10 Drawing Figures

ELECTROMAGNET SYSTEM FOR NUCLEAR SPIN TOMOGRAPHY

The present invention relates to an electromagnet system for nuclear spin tomography comprising a ferromagnetic yoke, two pole pieces arranged on the said yokes with their pole faces facing each other, the said pole pieces defining between them an air gap with a diameter-to-width ratio of less than 2.5, and comprising further at least one excitation coil generating in the air gap a magnetic field which in a spherical volume with a diameter equalling half the width exhibits a homogeneity better than $10^{-4}$.

A system of this type which is said to have the before-mentioned properties has been described in US-Z-Diagnostic Imaging, October 1985, pp. 134 to 139.

In nuclear spin tomography a human or animal body is exposed, for medical and biological examination, to a strong homogenous constant magnetic field and simultaneously to an additional r.f. field directed perpendicularly thereto. It is then possible, with the aid of known imaging techniques, to excite nuclear resonances in defined areas of the body, in particular in cross-sectional planes of the body, and to generate an image of the respective cross-sectional surface from the nuclear resonance signals received. This imaging technique makes it possible to obtain images of soft tissues, liquids or the like, which are rich in contrast, without any detrimental side-effects upon the body to be examined.

The nuclear spin tomographs intended to be used for the before-described measuring technique therefore require magnetic systems capable of generating, in a relatively large volume, a magnetic field which is constant as to space and time. Typically, it is necessary to generate a magnetic field of a strength of 0.1 to 5 Tesla and of a homogeneity better than $10^{-4}$ in a spherical volume having a diameter of 10 cm or more.

It has been known heretofore to use for this purpose pure air-coil systems of a normally conductive and superconductive type; on the other hand, it has also been known, for example from the before-mentioned journal, to use iron-core electromagnet systems for generating magnetic fields of the type described before.

General literature on electromagnets describes numerous configurations of such electromagnets which are used for general electrotechnical tasks, but also in physics, for example nuclear physics.

There have also been known numerous suggestions relating to the use of iron-core electromagnet systems for classical nuclear resonance experiments where a test substance is subjected to a nuclear resonance experiment in a test tube. Since the sample volume is very small in the case of such classical nuclear resonance experiments, it is not very difficult to generate the necessary very homogenous magnetic field if an iron-core electromagnet system is used, as the ratio between the diameter of the pole shoe and the air gap can easily reach a value of 5 or more. But the greater this ratio, the better is the homogeneity in the air gap between the pole surfaces of the pole shoes.

However, when a human or animal body is to be subjected to the constant magnetic field, either wholly or by sections, the air gaps required for this purpose must have a width of at least 20 cm, typically even 50 cm. If the conditions to be established were the same as those existing in classical nuclear resonance experiments with test tubes, i.e. if a ratio between the pole shoe diameter and the air gap of 5 or more were to be adjusted, the diameter of the pole shoe would have to be 2.5 m for an air gap of 50 cm width—a dimension which, realistically, cannot be realized with iron-core magnets.

One has already thought about overcoming this problem by improving the homogeneity in the air gap by giving the pole pieces or the pole shoes mounted on their fronts a special shape, so as to eliminate in this manner the need for an excessively large pole shoe diameter. It is mainly two concepts that have been generally accepted in this connection. On the one hand, it has been proposed by Rose in US-Z-Physical Review, 53, 1938, p. 715, to reduce the drop in field strength at the outer edge of the pole shoes by rings of a soft or hard-magnetic material fitted on the pole surface.

On the other hand, it was also generally known to give the front ends of the pole shoes a conical shape, and to design the conical shape preferably in such a manner that the imaginary points of the cones of both pole shoes coincide in one and the same point.

Although it has been possible in this manner to achieve notable improvements in homogeneity as compared with uncorrected pole shoes, these features alone are not yet sufficient for nuclear resonance experiments, in particular for nuclear spin tomography, if the diameter-to-width ratio is smaller than 2.5.

Finally, it has been known from the classical technique of nuclear resonance experiments with samples of the size of a test tube and with a ratio between the pole shoe diameter and the width of the air gap of 5 or more, to use so-called shim coils which are employed in groups for the fine adjustment of field gradients. Shim coils of this type have been known, for example, from US-Z-Review of Scientific Instruments, 32 (1961), pp. 241–250.

The use of shim coils of the type described by this publication is based on the idea that the magnetic field in the sample space can be expanded according to spherical surface functions and that one can then provide for each coefficient of the three-dimensional series expansion a suitable group of shim coils which influences only that specific coefficient, while the value of the magnetic field directed perpendicularly to the pole surfaces remains unchanged. This arrangement of shim coils is described as "orthogonal" in the art. The orthogonality of these shim coils is extremely important for nuclear resonance experiments, it being of course evident that the basic value of the magnetic field must not be changed during "shimming" of the magnetic field, i.e. during fine adjustment of the homogeneity, as any such change would lead to migration of the spectral lines during the nuclear resonance experiment.

In practice, the user of a nuclear resonance spectrometer makes use of a reference sample with an extremely pronounced, very narrow spectral line. This sample is initially introduced into the nuclear resonance spectrometer, and the individual gradients of the magnetic field are supplied one after the other with an excitation current, by means of a plurality of setting elements for the different sets of shim coils, until finally the best possible fine adjustment of the magnetic field is achieved, with homogeneities of up to $10^{-9}$.

The numbers of ampere turns used for exciting the shim coils are in the range of 10 ppm ($10^{-6}$) of the number of ampere turns of the main excitation coil.

In conceiving iron-core electromagnet systems one usually starts out from a dynamically balanced design of the excitation coils and the pole shoe. The field pattern near the center of symmetry, in a direction perpendicular to the pole faces, can be represented by the following series expansion:

$$B_z \ 32 \ B_o + b_2 \cdot z^2 + b_4 \cdot z^4 + b_6 \cdot z^6 + \ldots$$

The odd terms are missing in this series expansion due to the assumed symmetry of the electromagnet system. Whilst in the case of large ratios between the pole shoe diameter and the width of the air gap of, say, 5 or above small coefficients $b_i$ are obtained, so that an approximately homogeneous field is obtained at the center, this does no longer hold true if this ratio drops, for example to a value of 2.5 or less, when the width of the air gap rises and the pole shoe diameter is not increased in parallel.

With the aid of the before-described measures for influencing the shape of the pole shoes it is now possible, with regard to the above series expansion, to reduce the coefficient $b_2$ at least approximately to zero. The field pattern existing at the center of the electromagnet system can then be described by a parabolic curve of the fourth or a higher order. Whilst, as mentioned before, in the presence of large aperture ratios, these coefficients of the fourth order are so small that they would not be disturbing in the present context, this does no longer hold true for small aperture ratios of 2.5 or below.

The before-mentioned shim coils of the classical type for fine adjustment of the homogeneity of the magnetic field are no longer suited for homogenization in the presence of small aperture ratios because their influence on the homogeneity of the magnetic field is smaller by several orders than the inhomogeneity which results from the small aperture ratio with non-disappearing coefficients of the fourth or a higher order.

Now, it is the object of the present invention to improve an electromagnet system of the type mentioned at the outset in such a manner that electromagnet systems with ferromagnetic core and acceptable dimensions can be provided which in the presence of a small aperture ratio of 2.5 or less achieves a homogeneity of $10^{-4}$ or better in a volume whose diameter is equal to at least half the width of the air gap.

According to the invention, this object is achieved by an arrangement in which a substantially two-dimensional supplementary coil, whose number of ampere turns is between 0.1% and 10% of the number of ampere turns of the excitation coil, is arranged in the area of the plane of each of the pole faces.

This solves the problem underlying the invention fully and perfectly because given this number of ampere turns the supplementary coil arranged in the area of the plane of the pole faces has a notable influence on the homogeneity of the magnetic field so that the inhomogeneity resulting from the small aperture ratio can be compensated.

The supplementary coils are sized and positioned in line with the principles outlined for example in the book "Solenoid Magnet Design" by Montgomery, Wiley-Interscience, New York. One determines at first the field contribution of a current loop as an air coil, and calculates therefrom the sum of the whole supplementary coil system by superposition. The influence of the iron is determined with the aid of the reflection method whereby the currents are approximately doubled. If the magnetizing contribution of the ferromagnetic material is to be considered with greater precision, this can be achieved with the aid of conventional calculation programs. However, these complex programs do not provide the necessary accuracy required for judging the high homogeneity. Accordingly, certain experimental corrections will be necessary for the final selection of the supplementary coils. There are two criteria that can be used for optimizing the homogeneity. Firstly it is possible, as described above, to expand the field about the center of symmetry and to select the coils in such a manner that the sum of all expansion coefficients, up to a given order, is practically equal to zero. Considering that it is the objective of the present invention to achieve good homogeneity in the largest possible area, the expansion coefficient method which is valid only in the neighborhood of the origin of ordinates can be replaced by the demand that the mean square variation of the field, compared with a constant value, be minimized over the whole area of homogeneity. In the case of small relative areas of homogeneity, this method which is usually employed in error calculation leads to results which are comparable to those obtained by the expansion coefficient method.

It is possible in this manner to size, arrange and excite the supplementary coils in such a manner as to provide the necessary homogeneity. This procedure may, however, lead to solutions where some of the supplementary coils are operated with reverse polarity, compared with the main current direction. According to a preferred embodiment of the invention, the pole pieces and supplementary coils are of course sized in such a manner that the overall configuration of the main field with the shim rings and contributions by the corrective coils provide the necessary homogeneity.

In all described embodiments of the invention, the field of the supplementary coil—in particular in the form of a solenoid coil arranged coaxially to the main excitation coil—may be non-orthogonal relative to the magnetic field of the excitation coil, which means that the influence of the supplementary coil heterodynes with the influence of the main excitation coil itself in the center of the electromagnet system; this is, however, no disadvantage because the supplementary coil is excited constantly and not supplied with a variable current only for correction purposes, in the manner of classical fine-adjustment shim coils.

A particularly preferred embodiment of the invention provides for this purpose that the supplementary coils and the excitation coils are connected in series to a common power supply unit.

This feature is of particular advantage as the constant series connection between the supplementary coils and the excitation coils ensures that the supplementary coils are operated with the same current stability as the excitation coils. In addition, there is no need in this case for a separate power supply unit for the supplementary coils which helps save costs. And the current control is also simplified due to the fact that only a single automatic control system is required.

The arrangement of the supplementary coils may be realized in different manners in the electromagnet system according to the invention. According to one embodiment of the invention, the supplementary coils are arranged on the pole surface, while according to another embodiment of the invention the pole faces are each provided with a central recess receiving the supplementary coil. Finally, the pole pieces may also be embraced by the supplementary coil in the area of the plane of the pole faces.

In all these three cases it is an advantage that the influence of the supplementary coil acts directly in the plane of the pole faces.

As has been mentioned before, the basic homogeneity of the electromagnet system according to the invention is optimized by corresponding selection of the shape of the pole shoes, in particular by providing a shim ring of a soft or hard-magnetic material or by giving the pole pieces a conical shape.

Whilst the number of ampere turns of the supplementary coil may vary within very broad limits, one embodiment of the invention is particularly preferred where the supplementary coils are passed by a current of some 100 amperes.

According to another variant of the invention, the pole pieces and the supplementary coils may finally exhibit a rectangular cross section perpendicularly to the direction of the magnetic field.

This feature provides the known advantage that by selecting for example an elongated rectangular cross-sectional shape a magnetic field of considerable extension, perpendicularly to the direction of the constant magnetic field, can be generated in order to generate a homogenous magnetic field of long extension and to enable in this manner images of the whole body to be made without having to move the patient relative to the magnetic field.

Other advantages of the invention will become apparent from the specification and the attached drawing.

It goes without saying that the features that have been mentioned above and that will be described hereafter may be used not only in the stated combination, but also in other combinations or alone without leaving the scope of the present invention.

Certain embodiments of the invention will be described hereafter with reference to the drawing in which.

Figure 1:
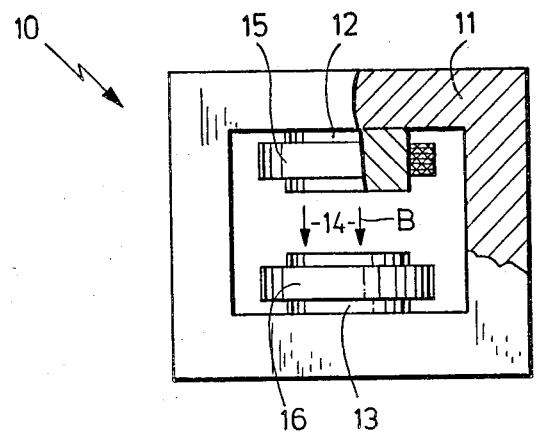
FIG. 1 shows an overall view, partly broken away, of an electromagnet system according to the invention with a H-shaped ferromagnetic yoke.

In FIG. 1, reference numeral 10 designates generally a magnet system with a ferromagnetic yoke 11 in H configuration comprising at its center pole pieces 12, 13 defining between them an air gap 14. The pole pieces 12, 13 carry excitation coils 15, 16 so that a magnetic field B extending perpendicularly to the pole face of the pole pieces 12, 13 is created in the air gap 14.

In the representation of FIG. 1, the yoke 11 exhibits a rectangular cross section, while the pole pieces 12, 13 have a circular cross section. It is, however, understood that these shapes are meant as examples only and that other cross-sectional shapes may be used without leaving the scope of the invention.

According to a particularly preferred embodiment of a magnet system having the configuration shown in FIG. 1, the yoke 11 has, for example, the shape of a plate so that it projects far beyond the pole pieces 12, 13 and the excitation coils 15, 16 also in the plane extending perpendicularly to the drawing plane of FIG. 1.

Figure 2:
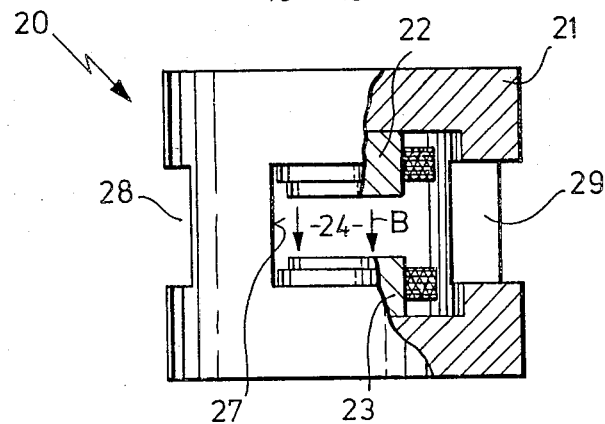
FIG. 2 is a representation similar to FIG. 1, but with a yoke of the pot core type.

FIG. 2 shows another embodiment of a magnet system designated generally by reference numeral 20. A yoke 21 of the magnet system 20 exhibits the structure of a pot core, with a circular top view. Pole pieces 22, 23 arranged along the vertical axis of the yoke 21 form again between them an air gap 24. Windows 27, 28, 29 distributed over the periphery of the outer jacket of the yoke 21 enable a patient to be introduced into the area of the air gap 24 for the purpose of exposing him there to the action of the magnetic field B. In addition, these windows enable the patient to be observed directly.

Figure 3:
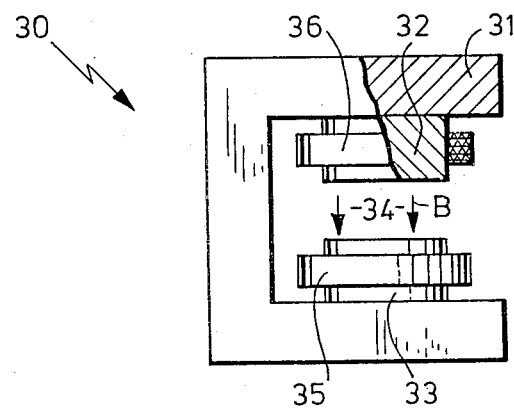
FIG. 3 is a representation similar to FIGS. 1 and 2, but with a C-shaped yoke.

FIG. 3 shows another embodiment of a magnet system, generally designated by reference numeral 30, comprising a C-shaped yoke 31 whose free ends carry pole pieces 32, 33 defining again between them an air gap 34. Excitation coils 35, 36 arranged on the pole pieces 32, 33 generate again a magnetic field B.

Figure 4:
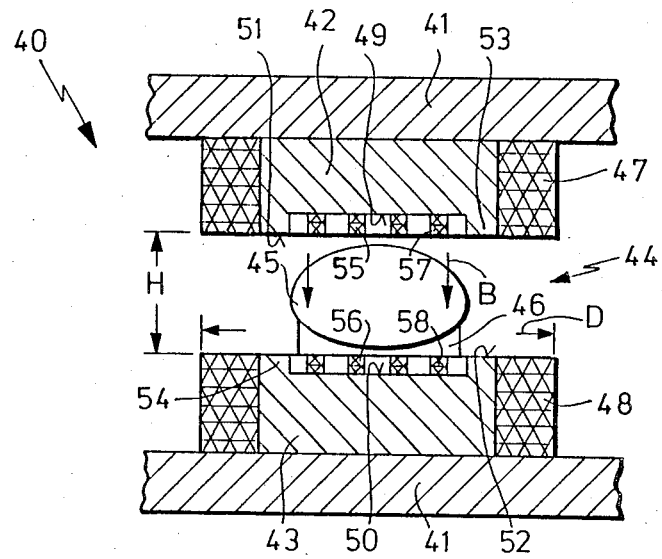
FIG. 4 shows a cross-sectional representation, in enlarged scale, of the area of the pole pieces of one embodiment of an electromagnet system according to the invention.

In FIG. 4, a magnet system 40 with plate-like yoke 41, which is partly broken away, is shown in enlarged scale for an embodiment similar to that shown in FIG. 1. Cylindrical or cuboid pole pieces 42, 43 define between them an air gap 44 having a diameter and/or a lateral length D and a width H. It appears from the representation of FIG. 4 that the D-to-H ratio is relatively small; for the applications interesting in the present case it may, for example, be equal to 2.5 or 2. It is thus possible to achieve with an acceptable diameter D an air gap width H of 40 or more centimeters which is sufficiently large to enable a patient—indicated by reference numeral 45—lying on a stretcher 46 to be introduced into the area of the air gap 44.

The pole pieces 42, 43 are again surrounded by excitation coils 47, 48 so that the magnetic field B is again generated in the air gap 44.

From the representation of FIG. 4 it appears further that the pole pieces 42, 43 are provided with central recesses 49, 50 with supplementary coils 55, 56, 57, 58 arranged therein in the area of the pole faces 51, 52. As a result of these recesses 49, 50, so-called annular shims 53, 54 of the type generally known in connection with electromagnets for the generation of homogenous magnetic fields are formed in the marginal areas of the pole faces 51, 52.

Figure 5:
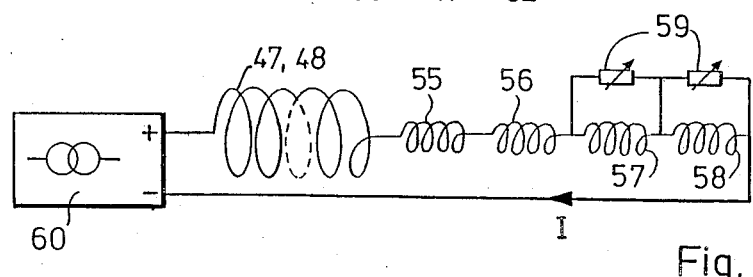
FIG. 5 shows a circuit diagram illustrating the electric wiring of an electromagnet system according to the invention.

FIG. 5 shows a preferred wiring arrangement for the excitation coils 47, 48 and the supplementary coils 55, 56, 57, 58. The arrangement comprises a power supply unit 60 feeding a highly stabilized current I through the series-connected excitation coils 47, 48 and the supplementary coils 55, 56, 57, 58 which are again connected in series. This means that the excitation coils 47, 48 and the supplementary coils 55, 56, 57, 58 are passed by the same current I.

For fine adjustment of the excitation current of the supplementary coils 55, 56, 57, 58, variable resistors 59 arranged in parallel to one of the supplementary coils 55, 56, 57, 58 may be provided. This permits the use of a single current source for the supply of the magnet system even when the necessary operating currents of the supplementary coils 55, 56, 57, 58 differ slightly from the operating current of the excitation coils 47, 48.

In one practical embodiment of a magnet system of the invention of the type shown in FIG. 4, the yoke 41 exhibited approximately the following dimensions in a top view similar to that of FIG. 1: width 2.7 m., height 1.2 m.; the diameter D of the cylindrical pole shoes 42, 43 was equal to 0.96 m., and the width H of the air gap 44 was 0.47 m. The excitation coils 47, 48 had a number of ampere turns of 2 times 72200 ampere turns, at an operating current of 282 amperes. The supplementary coils 55, 56, 57, 58 were connected in series with the excitation coils 47, 48 and were, consequently, also supplied with an excitation current of 282 amperes. The inner pair of supplementary coils 55, 56 had a diameter of 0.46 m. with 1128 ampere turns; the outer pair of supplementary coils 57, 58 had a diameter of 0.68 m. with 2256 ampere turns. The wiring was effected in such a manner that the pair of inner supplementary coils 55, 56 provided a positive, the pair of outer supplementary coils 57, 58 a negative contribution to the main field B. For comparison only it should be noted in this connection that classical orthogonal shim coils with individually adjustable power supply units for fine homogenization of the magnetic field would have to be provided with approximately ten ampere turns.

Figure 6:
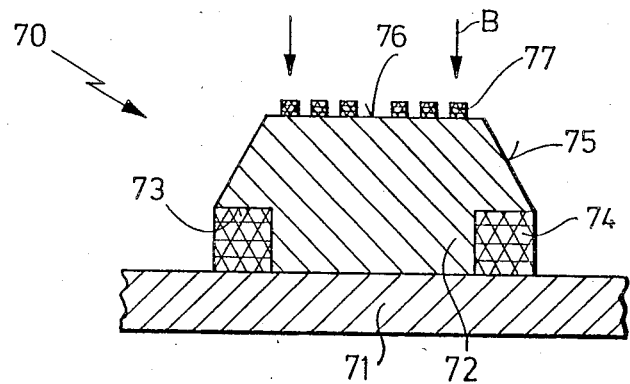
FIG. 6 is a representation, partly similar to FIG. 4, relating to a differently shaped electromagnet system according to the invention.

FIG. 6 shows a representation similar to FIG. 4, but only for half the elements shown there. One can see a magnet system 70 with a ferromagnetic yoke 71 and a pole piece 72 provided on its lower end with a circumferential shoulder so that when the pole piece 72 is attached to the yoke 71 an annular groove 73 is formed for receiving the excitation coil 74. The forward end of the pole piece 72 ends in a conical portion 75 so that a pole face 76 of reduced cross-section is obtained. The pole face 76 carries a supplementary coil 77.

The particular characteristic of the magnet system 70 of FIG. 6 is seen in the fact that the special configuration in the area of the annular groove 73 permits the use of excitation coils 74 of smaller diameter which leads to a notable reduction in power. This requires, however, that the air gap induction must be clearly smaller than the saturation induction of the iron used because flow concentration occurs in the pole pieces 72 in the area of the excitation coils 74.

Figure 7:
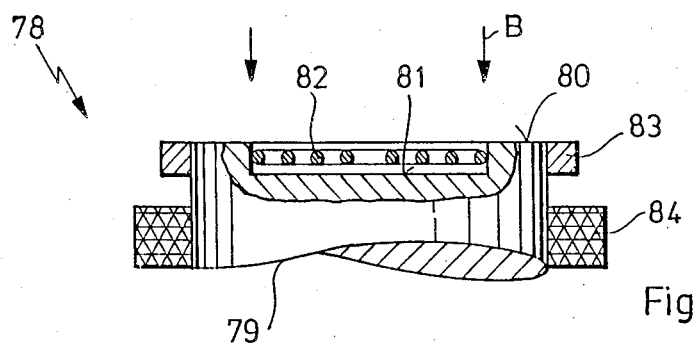
FIG. 7 is a cross-sectional view, in still further enlarged scale, illustrating another embodiment of the invention.

Another embodiment of the invention as shown in FIG. 7 comprises a magnet system 78 whose cylindrical pole pieces 79 are again provided, in the area of the pole face 80, with a recess 81 for receiving a supplementary coil 82, as shown already in FIG. 4. However, unlike the embodiment shown in this latter figure, the magnet system 78 according to FIG. 7 is provided with a laterally projecting shim ring 83 forming an effective enlargement of the pole face 80.

Figure 8A:
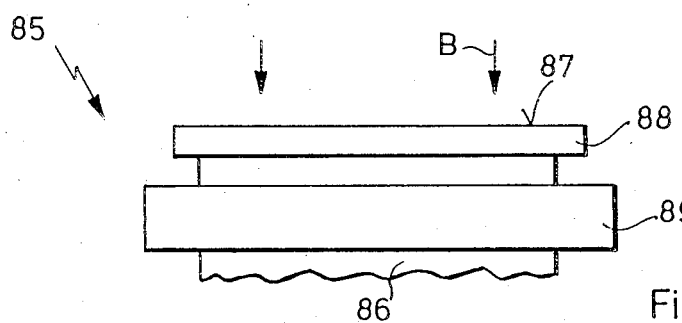
FIGS. 8a and 8b show two views of an arrangement of supplementary coils in another embodiment of the invention.
Figure 8B:
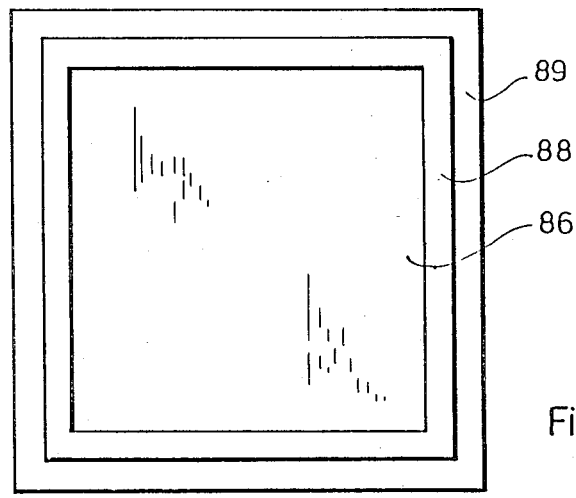

Still another embodiment of a magnet system 85 as shown in FIGS. 8a and 8b comprises pole pieces 86 of square or—more generally speaking—of rectangular cross section. This leads to a likewise square pole face 87 whose edges are delimited laterally by the supplementary coils 88 fitted on the pole pieces 86. Excitation coils 89 are arranged axially below the supplementary coil 88.

Figure 9:
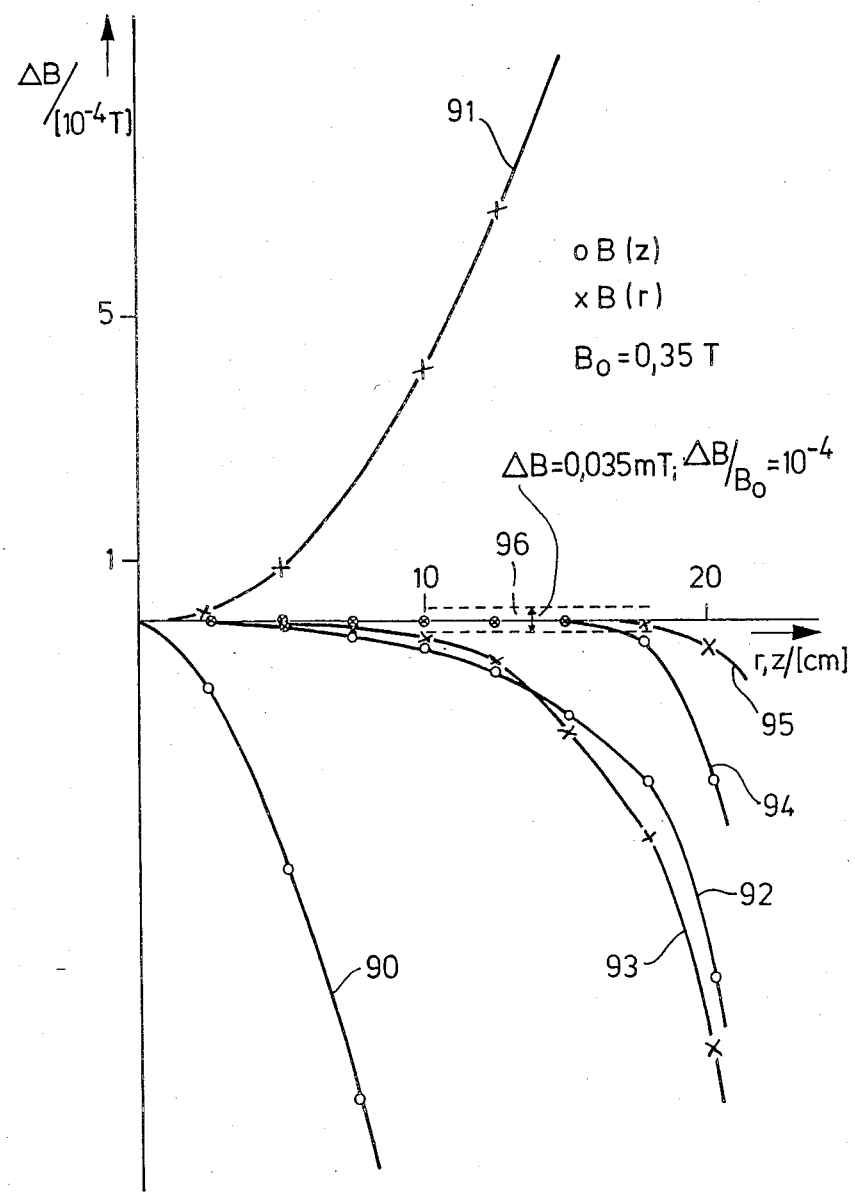
FIG. 9 shows a diagram of the field variation plotted against two coordinates, illustrating the effect of the invention as compared with the prior art.

Finally, FIG. 9 shows a diagram illustrating the effects achieved by the present invention.

In FIG. 9, the field variations are plotted in pairs in units of $10^{-4}$ Tesla, for the axial field curve B(z) represented by small circles, and for a radial field curve B(r) represented by small crosses. The axial curve B(z) corresponds to the values B in the previous figures. The curves represented in FIG. 9 were recorded from a practical embodiment of the invention of the type described above in connection with FIG. 4, stating concrete figures.

Curves 90, 91 in FIG. 9 show initially the field variation for a pole shoe of non-optimized shape. It can be seen that after only a few centimeters the field variations are already so important that the electromagnet system is absolutely unsuited for nuclear resonance experiments.

Curves 92 and 93 represent the corresponding field variations for a pole shoe with optimized annular shim where the coefficient of the second order disappears with good approximation in the series expansion of the fields, while at the same time a coefficient of the fourth order has been minimized to the extent possible.

It will, however, be realized that the curves 92, 93 still show very important field variations after only a few centimeters which do not permit the use of the system for nuclear resonance experiments.

Now, curves 94, 95 represent measurements that have been obtained with the embodiment of the invention described with reference to FIG. 4, using supplementary coils likewise described in this context.

As can be seen easily from curves 94, 95, an area 96 corresponding to a homogeneity value of approximately $10^{-4}$ is not left over a distance of more than 15 cm from the center of the electromagnet system. This means that nuclear resonance experiments are rendered possible in a three-dimensional area of a size which is necessary to obtain cross-sectional images of the whole body of a grown-up man.

We claim:

1. Electromagnet system for nuclear spin tomography comprising a ferromagnetic yoke, two pole pieces arranged on the said yoke with their pole faces facing each other, the said pole pieces defining between them an air gap of a width H, and comprising further at least one excitation coil, wherein the diameter D of the said pole faces is at the most equal to 2.5 times the value of the width H of the said air gap and wherein at least one substantially two-dimensional supplementary coil is arranged in the area of the plane of each of the said pole faces, whose number of ampere turns is between 0.1% and 10% of the number of ampere turns of the excitation coil and whose field, added to the field generated by the excitation coil, leads in the air gap to a resulting magnetic field (B) which, in a spherical volume having a diameter equal to half the value of the width (H) of the air gap, exhibits a homogeneity theoretically better than $10^{-4}$.

2. Electromagnet system according to claim 1, wherein the fields of the supplementary coils are non-orthogonal relative to the magnetic field (B) of the said excitation coil.

3. Electromagnet system according to claim 1, wherein the said supplementary coils and the said excitation coils are connected in series to a common power supply unit.

4. Electromagnet system according to claim 1, wherein the said supplementary coils are arranged on top of the said pole surface.

5. Electromagnet system according to claim 1, wherein the said pole faces are each provided with a central recess receiving the said supplementary coil.

6. Electromagnet system according to claim 1, wherein the said pole pieces are embraced by the said supplementary coil in the area of the plane of the said pole faces.

7. Electromagnet system according to claim 1, wherein the said pole pieces are provided with a ferromagnetic shim ring in the area of the plane of the said pole faces.

8. Electromagnet system according to claim 1, wherein the said pole pieces taper conically toward the said pole face.

9. Electromagnet system according to claim 1, wherein the current (I) flowing through the said supplementary coils has a value of some 100 amperes.

10. Electromagnet system according to claim 1, wherein the said pole pieces and the said supplementary coils exhibit a rectangular cross-section in a plane extending perpendicularly to the direction of the magnetic field (B).

* * * * *